(12) United States Patent
Schröder

(10) Patent No.: US 6,215,135 B1
(45) Date of Patent: Apr. 10, 2001

(54) INTEGRATED CIRCUIT PROVIDED WITH ESD PROTECTION MEANS

(75) Inventor: Hans U. Schröder, Kilchberg/Zürich (CH)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/365,465

(22) Filed: Aug. 2, 1999

(30) Foreign Application Priority Data

Aug. 4, 1998 (EP) .................................................. 98202623

(51) Int. Cl.$^7$ .............................. H01L 29/74; H01L 23/62
(52) U.S. Cl. .............................. 257/173; 257/355; 361/56
(58) Field of Search ................................... 257/355–363, 257/546, 547, 173, 174; 361/56

(56) References Cited

U.S. PATENT DOCUMENTS

| | | | |
|---|---|---|---|
| 5,400,202 | * | 3/1995 | Metz et al. ............................. 361/56 |
| 5,576,557 | * | 11/1996 | Ker et al. .............................. 257/173 |
| 5,615,073 | | 3/1997 | Fried et al. ............................. 361/56 |
| 5,739,998 | * | 4/1998 | Wada ..................................... 361/56 |
| 6,081,002 | * | 6/2000 | Amerasekera et al. ............... 257/173 |

FOREIGN PATENT DOCUMENTS

0774785A2    5/1997    (EP) .

* cited by examiner

*Primary Examiner*—William Mintel
*Assistant Examiner*—Ori Nadav
(74) *Attorney, Agent, or Firm*—Steven R. Biren

(57) ABSTRACT

An integrated circuit provided with ESD protection means comprising a silicon-controlled rectifier whose n-well (WLL), if the substrate (SBSTR) of the integrated circuit is of the p-type, is connected to the VDD supply instead of to the bonding-pad (BP) to which electronic circuitry is connected. Consequently, the anode is only formed by the $p^+$ diffusion (d4) in the n-well (WLL). Therefore, negative voltages are allowed at the bonding pad (BP) because the junction is not forward-biased. Thus, an ESD protection towards the VSS is obtained. Additionally, a PMOST (MP) is used as an ESD protection towards the VDD.

1 Claim, 1 Drawing Sheet

INTEGRATED CIRCUIT PROVIDED WITH ESD PROTECTION MEANS

BACKGROUND OF THE INVENTION

The invention relates to an integrated circuit comprising protection means for protecting against electrostatic discharge, which protection means is provided on a substrate of a first conductivity type, and said protection means comprises a first highly doped surface area of a second, opposite, conductivity type, a second highly doped surface area of the second conductivity type, a first gate insulated from the surface of the integrated circuit, which first gate is positioned so as to form a first MOS-device in conjunction with the first and the second highly doped surface areas, and a third highly doped surface area of the first conductivity type, which is located directly beside the second highly doped surface area, the first gate and the second and the third highly doped surface areas are electrically coupled to a first reference terminal, the substrate being provided with a well of the second conductivity type, the well being partly stretched out into the region of the first highly doped surface area, and the well being provided with a fourth highly doped surface area of the first conductivity type which is electrically coupled to a bonding pad BP of the integrated circuit.

Such an integrated circuit is known from the general state of the art. The fourth highly doped surface area, the well, the substrate, and the second highly doped surface area together form an SCR element (Silicon-Controlled Rectifier). The SCR element is in fact a four-layer pnpn (or npnp) structure with connections on the outer p-layer and the outer n-layer. One of the connections is formed by the fourth highly doped surface area and the other one of the connections is formed by the second highly doped surface area. A purpose of the protection means is to avoid damage in the integrated circuit caused by electrostatic discharge (ESD). In general, diodes, Field oxide NMOS, thin oxide NMOS, and Silicon Controlled Rectifiers are used as ESD protection means.

A problem of the known ESD protection means is that if for instance the bonding pad is negatively biased with respect to the first reference terminal, no $n^+$ diffusion is to be electrically connected to the bonding pad in a p-substrate CMOS integrated circuit, because the $n^+$ diffusion at the bonding-pad would be forward biased with respect to the substrate. This would cause a current through the substrate, which adversely affects the behaviour of the integrated circuit. For the same reason, an $n^+/p$ diode and an NMOS as ESD protection means coupled to the first reference terminal is not allowed.

SUMMARY OF THE INVENTION

It is an object of the invention to solve the above-mentioned problem.

An inventive integrated circuit of the type described in the opening paragraph is therefore characterized in that the well further comprises a fifth highly doped surface area of the first conductivity type, a second gate insulated from the surface of the integrated circuit, and a sixth highly doped surface area of the second conductivity type which is located directly beside the fifth highly doped surface area, and in that the second gate is positioned so as to form a second MOS-device in conjunction with the fourth and the fifth highly doped surface areas, and in that the second gate and the fifth and the sixth highly doped surface areas are electrically coupled to a second reference terminal. As a result, the protection means provide for two protection paths. Let us for example assume that the first conductivity type is the p-type and the second conductivity type is the n-type. Then one of the two protection paths, hereinafter referred to as first protection path, comprises a $p^+$ n diode, which is formed by the $p^+$ diffusion (the fourth highly doped surface area) at the bonding pad and the n-well (i.e. the well if the second conductivity type is the n-type). Thus, the first protection path forms an ESD-protection between the bonding pad and the second reference terminal. The other one of the two protection paths, hereinafter referred to as the second protection path, is formed by the SCR of which, in this example, the outer p-layer is formed by the fourth $p^+$ doped surface area in the n-well, and of which the outer n-layer is formed by the second $n^+$ doped surface area in the p-type substrate. In this example, in which the first conductivity type is the p-type and the second conductivity type is the n-type, the protection means according to the invention do not have an $n^+$ diffusion which is electrically connected to the bonding-pad. This is in contrast with the known protection means.

BRIEF DESCRIPTION OF THE DRAWING

The invention will be described in more detail with reference to the accompanying drawings, in which.

In these Figures, parts or elements having like functions or purposes bear the same reference symbols.

DESCRIPTION OF THE PREFERRED EMBODIMENTS

Figure 1:
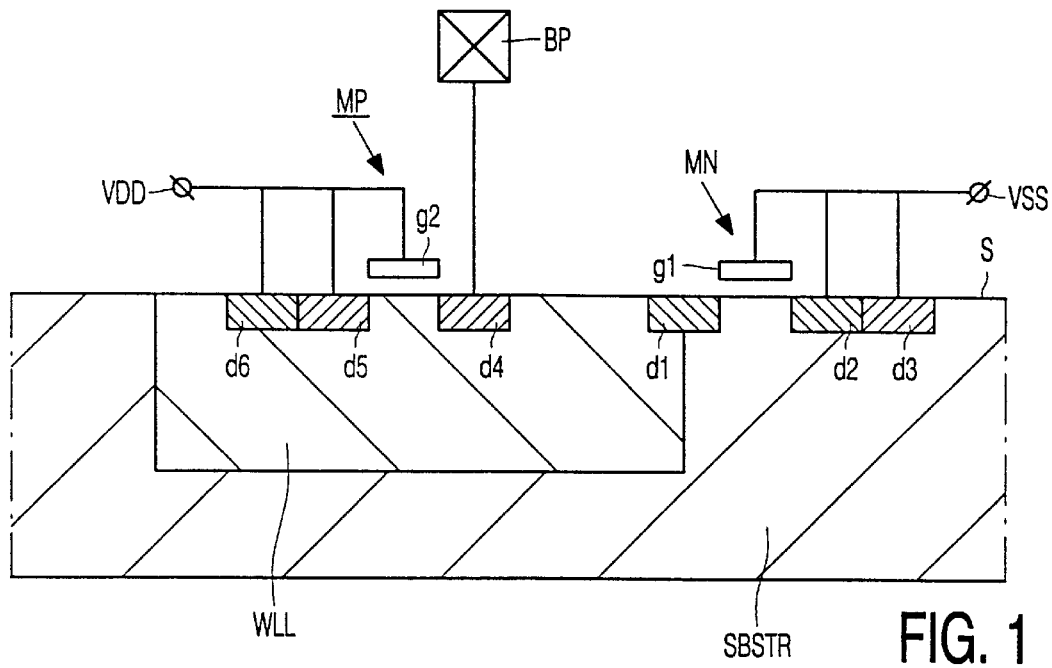
FIG. 1 is a cross-sectional view of a part of an integrated circuit having input protection means for protecting against electrostatic discharge.

FIG. 1 is a cross-sectional view of a part of an integrated circuit having input protection means for protecting against electrostatic discharge. It is assumed by way of example that the integrated circuit comprises a p-type substrate SBSTR. As a result the well WLL is of the n-type, and will hereinafter be referred to as the n-well WLL. The integrated circuit is provided with highly doped surface areas d1, d2 and d6 of the n-type, which will hereinafter be referred to as $n^+$ areas, and with highly doped surface areas d3, d4 and d5 of the p-type which will hereinafter be referred to as $p^+$ areas. A first gate g1 and the $n^+$ areas d1 and d2 jointly form a first MOS-device MN. The first gate g1, the $n^+$ area d2, and the $p^+$ area d3 are electrically connected to a first reference terminal VSS. A second gate g2 and the $p^+$ areas d4 and d5 jointly form a second MOS-device MP. The second gate g2, the $p^+$ area d5, and the $n^+$ area d6 are electrically connected to a second reference terminal VDD. The $p^+$ area d4, the p area d5, and the $n^+$ area d6 are located within the n-well WLL. The $n^+$ area d1 is only partially located within the n-well WLL. The $p^+$ area d4 is electrically connected to a bonding pad BP of the integrated circuit. The bonding pad BP is for instance an input pad which is electrically connected to an input of an electronic circuit (not shown in the Figures) of the integrated circuit. Very often, a gate of a MOS-transistor of the electronic circuit is electrically connected to the input pad. Such a MOS-transistor can very easily be damaged by an electrostatic discharge on its gate because the gate of such a MOS-transistor has a very high input impedance. The protection means, as shown in FIG. 1, limits the voltage at the bonding pad, caused by an electrostatic discharge, for both positive and negative voltage spikes. An important difference between the protection means of FIG. 1 and known protection means is that, irrespective of the polarity of the voltage spikes there will be no current flowing through the substrate SBSTR. This can be attributed to the fact that, using the protection means of FIG. 1, no $n^+$ area is connected to the bonding pad BP since the n-well WLL is connected, via the $n^+$ area d6, to the second reference terminal VDD, whereas in known protection means the n-well WLL is connected to the bonding-pad BP, causing substrate currents, which adversely affects the behaviour of the electronic circuit on the integrated circuit.

Figure 2:
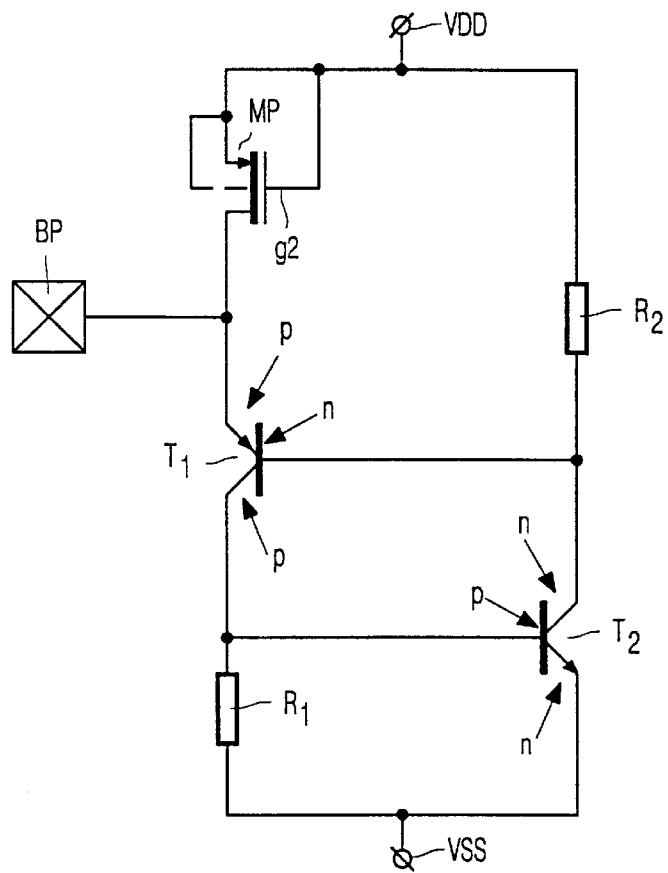
FIG. 2 shows a simplified electrical circuit diagram corresponding to the part of the integrated circuit shown in FIG. 1.

FIG. 2 shows a simplified electrical circuit diagram corresponding to the part of the integrated circuit shown in FIG. 1. The source and the back gate of the second MOS-transistor MP, which are formed respectively by the $p^+$ area d5 and the n-well WLL, are connected to the second reference terminal VDD. The second gate g2 is also connected to the second reference terminal VDD. A drain of the MOS-transistor MP, being the $p^+$ area d4, is connected to the bonding pad BP. A first bipolar transistor $T_1$ is with an emitter connected to the bonding pad BP, with a collector to a base of a second bipolar transistor $T_2$, and with a base to a collector of the second bipolar transistor $T_2$. The collector of the first bipolar transistor $T_1$ is connected via a first resistor $R_1$ to the first reference terminal VSS. The collector of the second bipolar transistor $T_2$ is connected via a second resistor $R_2$ to the second reference terminal VDD. The emitter of the second bipolar transistor $T_2$ is connected to the first reference terminal VSS. The first resistor $R_1$ is caused by the resistance of the substrate SBSTR between the $n^+$ area d1 and the $p^+$ area d3. The second resistor $R_2$ is caused by the resistance of the n-well WLL between the $n^+$ area d1 and the $n^+$ area d6. The first and second bipolar transistors $T_1$–$T_2$, and the first and second resistors $R_1$–$R_2$ together form the SCR the operation of which is well known.

It will be evident that the invention is not restricted to the examples described above, but that within the framework of the invention a great many variations are possible to the expert. In the examples described above, the conductivity types may be reversed, in which case, of course, the voltages to be applied must be adapted.

What is claimed is:

1. An integrated circuit comprising protecting means for protection against electrostatic discharge, which protection means is provided on a substrate (SBSTR) of a first conductivity type, and said protection means comprises a first highly doped surface area (d1) of a second, opposite, conductivity type, a second highly doped surface area (d2) of the second conductivity type, a first gate (g1) insulated from the surface (S) of the integrated circuit, which first gate (g1) is positioned so as to form a first MOS-device (MN) in conjunction with the first (d1) and the second (d2) highly doped surface areas, and a third highly doped surface area (d3) of the first conductivity type which is located directly beside the second highly doped surface area (d2), the first gate (g1) and the second (d2) and the third (d3) highly doped surface areas are electrically coupled to a first reference terminal (VSS), the substrate (SBSTR) being provided with a well (WLL) of the second conductivity type, the well (WLL) being partly stretched out into the region of the first highly doped surface area (d1), and the well (WLL) being provided with a fourth highly doped surface area (d4) of the first conductivity type which is electrically coupled to a bonding pad (BP) of the integrated circuit, characterized in that the well (WLL) further comprises a fifth highly doped surface area (d5) of the first conductivity type, a second gate (g2) insulated from the surface (S) of the integrated circuit, and a sixth highly doped surface area (d6) of the second conductivity type, which is located directly beside the fifth highly doped surface area (d5), and in that the second gate (g2) is positioned so as to form a second MOS-device (MP) in conjunction with the fourth (d4) and the fifth (d5) highly doped surface areas, and in that the second gate (g2) and the fifth (d5) and the sixth (d6) highly doped surface areas are electrically coupled to a second reference terminal (VDD).

\* \* \* \* \*